US009361990B1

(12) United States Patent
Louie et al.

(10) Patent No.: US 9,361,990 B1
(45) Date of Patent: Jun. 7, 2016

(54) TIME DOMAIN RAMP RATE CONTROL FOR ERASE INHIBIT IN FLASH MEMORY

(71) Applicant: SanDisk Technologies, Inc., Plano, TX (US)

(72) Inventors: Kenneth Louie, Sunnyvale, CA (US); Khanh Nguyen, Fremont, CA (US)

(73) Assignee: SanDisk Technologies, Inc., Plano, TX (US)

( * ) Notice: Subject to any disclaimer, the term of this patent is extended or adjusted under 35 U.S.C. 154(b) by 0 days.

(21) Appl. No.: 14/574,832

(22) Filed: Dec. 18, 2014

(51) Int. Cl.
G11C 16/04 (2006.01)
G11C 16/14 (2006.01)
G11C 16/24 (2006.01)

(52) U.S. Cl.
CPC ............ *G11C 16/14* (2013.01); *G11C 16/0483* (2013.01); *G11C 16/24* (2013.01)

(58) Field of Classification Search
CPC ............... G11C 16/0483; G11C 16/14; G11C 11/5635; G11C 7/12
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Hararj et al. | |
| 5,343,063 A | 8/1994 | Yuan et al. | |
| 5,570,315 A | 10/1996 | Tanaka et al. | |
| 5,595,924 A | 1/1997 | Yuan et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 2005/0068808 A1* | 3/2005 | Quader | G11C 16/14 365/185.18 |
| 2006/0114719 A1* | 6/2006 | Lee | G11C 16/04 365/185.17 |
| 2008/0089133 A1* | 4/2008 | Ito | G11C 8/10 365/185.22 |
| 2009/0279360 A1* | 11/2009 | Lee | G11C 11/5628 365/185.17 |
| 2011/0188321 A1 | 8/2011 | Kito et al. | |
| 2012/0120740 A1 | 5/2012 | Shim et al. | |
| 2012/0220088 A1 | 8/2012 | Alsmeier | |
| 2013/0107628 A1 | 5/2013 | Dong et al. | |
| 2014/0003157 A1 | 1/2014 | Mui et al. | |
| 2014/0169095 A1 | 6/2014 | Avila et al. | |
| 2014/0247667 A1* | 9/2014 | Dutta | G11C 16/14 365/185.22 |
| 2015/0078100 A1* | 3/2015 | Nakayama | G11C 16/26 365/185.29 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
U.S. Appl. No. 13/927,659, filed Jun. 26, 2013, 41 pages.

(Continued)

*Primary Examiner* — Tuan T Nguyen
(74) *Attorney, Agent, or Firm* — Davis Wright Tremaine LLP

(57) ABSTRACT

When performing an erase on a flash type non-volatile memory with a NAND type of structure, techniques are presented for inhibiting erase on selected word lines, select lines of programmable select transistors, or some combination of these. The voltage along the selected control lines are initially ramped up by the level on a corresponding input line, but then have their voltage raised to an erase inhibit level by capacitive coupling with the well structure. The level of these input signals are ramped up with the erase voltage applied to the well structure, but with a delay based upon the coupling ratio between the control line and the well.

15 Claims, 16 Drawing Sheets

(56) References Cited

OTHER PUBLICATIONS

U.S. Appl. No. 13/925,662, filed Jun. 24, 2013, 36 pages.
U.S. Appl. No. 14/328,018, filed Oct. 7, 2014, 38 pages.
U.S. Appl. No. 14/486,152, filed Sep. 15, 2014, 55 pages.
U.S. Appl. No. 14/508,352 filed Oct. 7, 2014, 64 pages.

* cited by examiner

TIME DOMAIN RAMP RATE CONTROL FOR ERASE INHIBIT IN FLASH MEMORY

BACKGROUND

This application relates to the operation of re-programmable non-volatile memory systems such as semiconductor flash memory that record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. For example, a nonvolatile memory cell may have a trapping dielectric sandwiched between two silicon dioxide layers. Multi-state data storage is implemented by separately reading the binary states of the spatially separated charge storage regions within the dielectric.

SUMMARY

A non-volatile memory circuit includes a string of a plurality of series connected programmable threshold transistors formed on a common channel structure and a plurality of control lines along which control gates of the programmable threshold transistors are connected. Driver circuitry is connectable to the control lines and to the channel structure and a plurality of input lines are connected to the driver circuitry. The driver circuitry is selectably connectable through the input lines to the control lines through commonly controlled decoding transistors. Decoder circuitry is connectable to control gates of the decoding transistors, wherein each of the input lines is connected to a corresponding one of the control lines through a corresponding one of the decoding transistors. When performing an erase operation on the string, the decoding circuitry applies a select voltage to the gates of the commonly controlled decoding transistors. With the decoding transistors on, the driving circuitry: applies an erase enable voltage to the input lines connected through corresponding ones of the decoding transistors to the control gates of programmable threshold transistors selected for erase; applies a voltage that ramps up to an erase level to the channel structure; and for a plurality of programmable threshold transistors selected to not be erased, applies an erase inhibit voltage to the input lines connected through corresponding ones of the decoding transistors, wherein after a delay the erase inhibit voltage ramps up with the voltage applied to the channel structure to a level sufficient to turn off the corresponding ones of the decoding transistors. The amount of delay is one of a plurality of values dependent upon the location of the programmable threshold transistors to which it is applied within the string.

A method is also presented for the operating of a non-volatile memory circuit that has a string of a plurality of series connected programmable threshold transistors formed on a common channel structure and having control gates connected along control lines, with the control lines connected through a plurality of commonly controlled decoding transistors to a plurality of input lines. The method includes performing an erase operation on the string. The erase operation applies a select voltage to the gates of the commonly controlled decoding transistors. While applying the select voltage to the gates of the commonly controlled decoding transistors, an erase enable voltage is applied to the input lines connected through corresponding ones of the decoding transistors to the control gates of one or more programmable threshold transistors selected for erase; a voltage that ramps up to an erase level is applied to the channel structure; and, for a plurality of programmable threshold transistors selected to not be erased, applying an erase inhibit voltage is applied to the input lines connected through corresponding ones of the decoding transistors. After a delay the erase inhibit voltage ramps up with the voltage applied to the channel structure to a level sufficient to turn off the corresponding ones of the decoding transistors, where the amount of delay is one of a plurality of values dependent upon the location of the programmable threshold transistors to which it is applied within the string.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
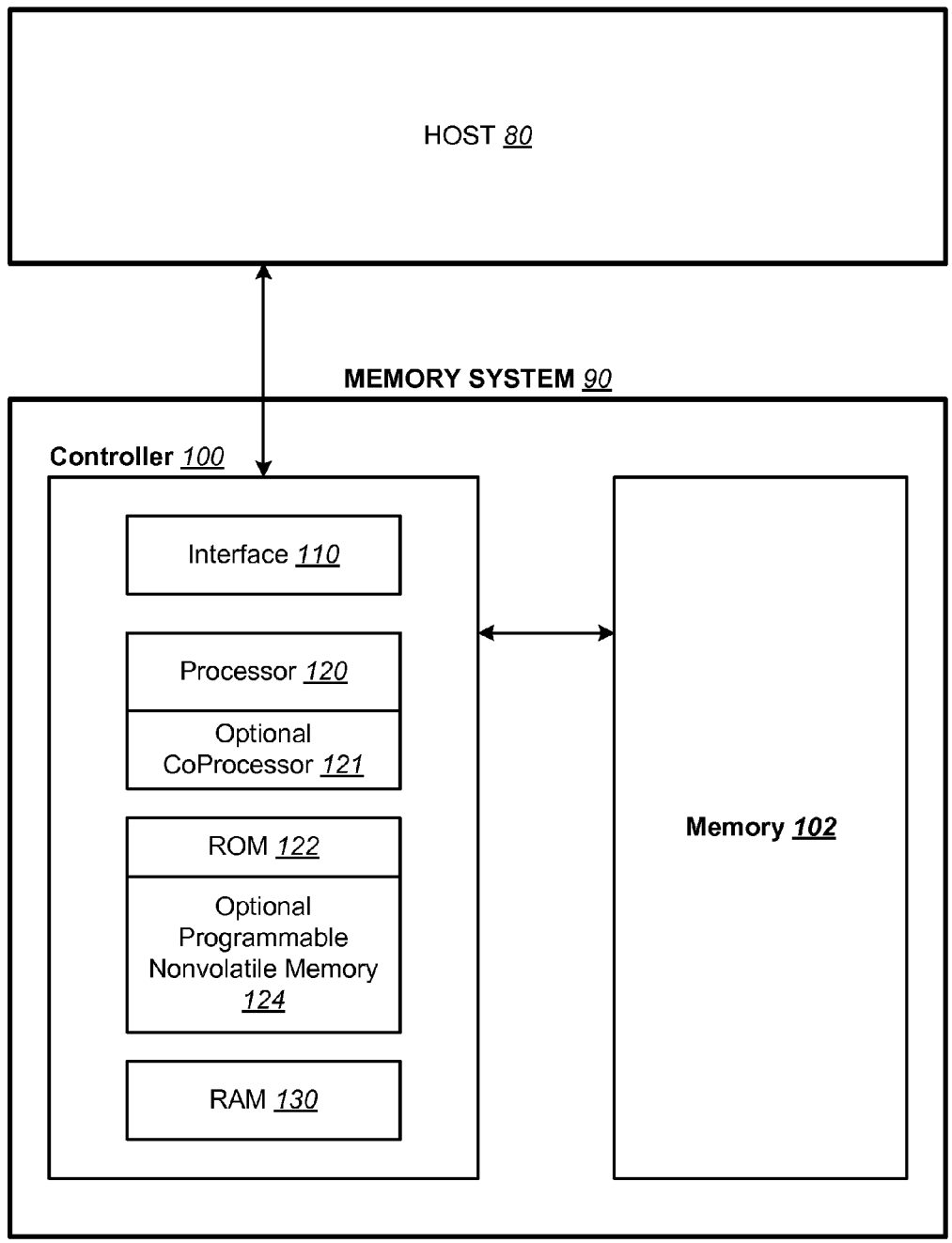
FIG. 1 illustrates schematically the main hardware components of a memory system suitable for implementing various aspects described in the following.

FIG. 1 illustrates schematically the main hardware components of a memory system suitable for implementing the following. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
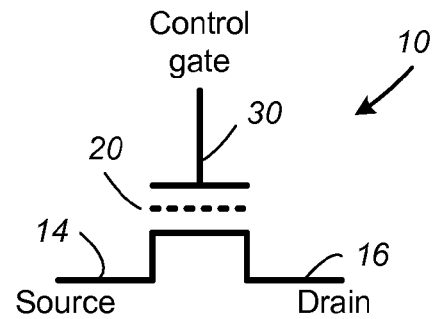
FIG. 2 illustrates schematically a non-volatile memory cell.

It will be recognized that the following is not limited to the two dimensional and three dimensional exemplary structures described but cover all relevant memory structures within the spirit and scope as described herein Physical Memory Structure FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
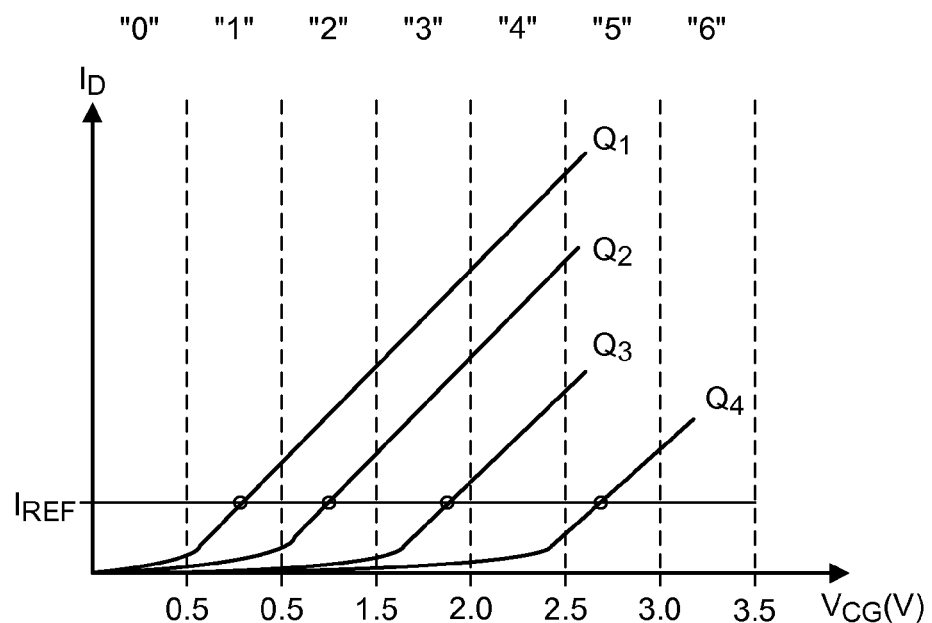
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
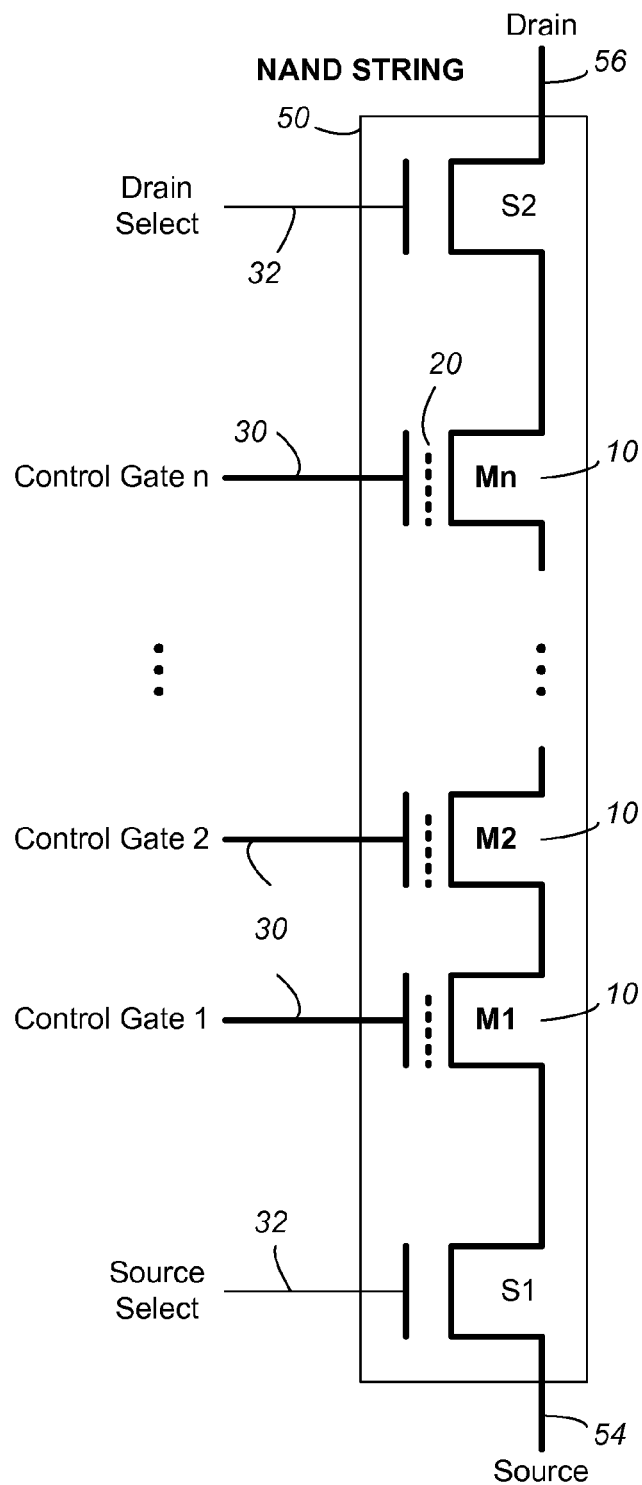
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 5:
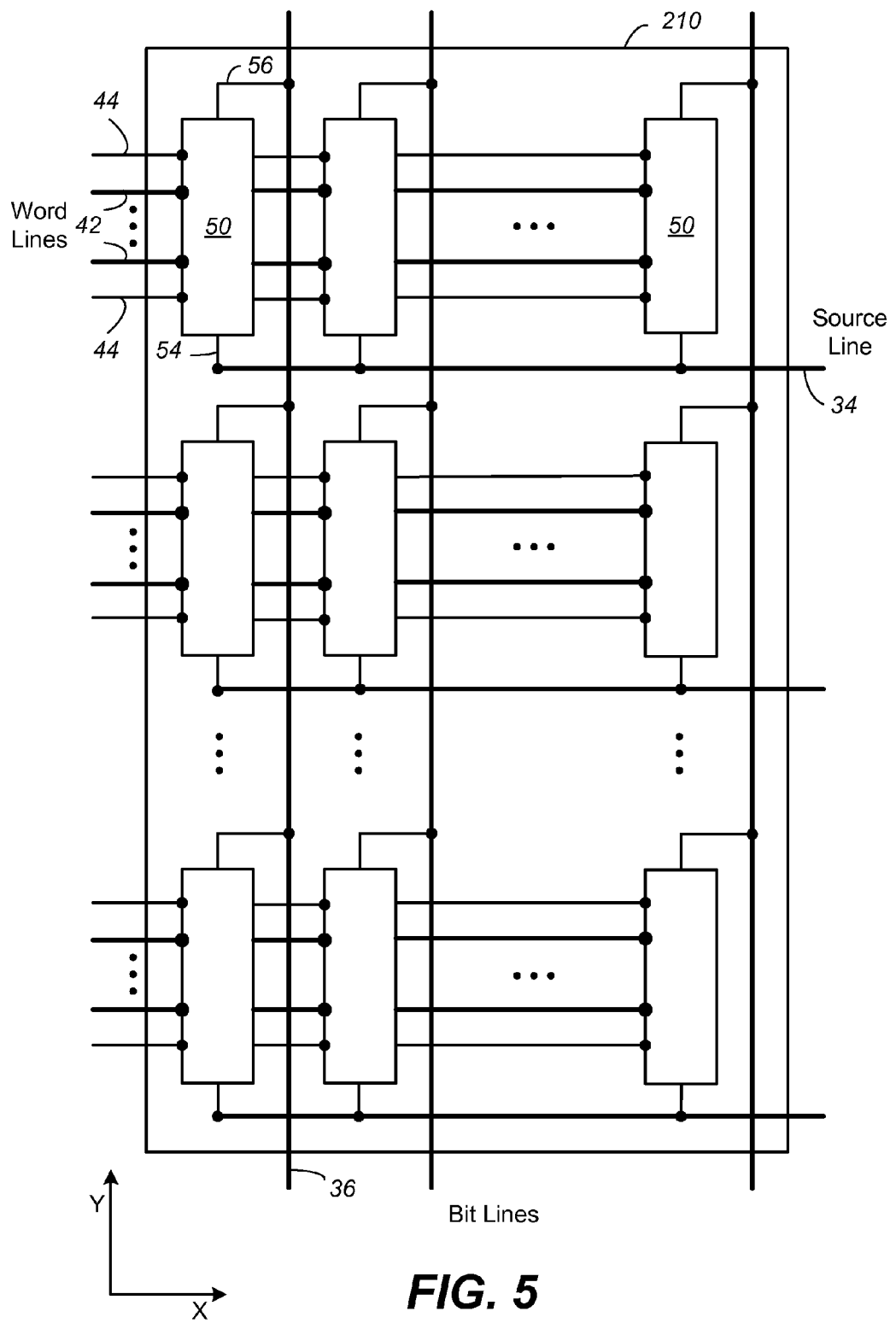
FIG. 5 illustrates an example of a NAND array 210 of memory cells, constituted from NAND strings 50 such as that shown in FIG. 4.

FIG. 5 illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 6:
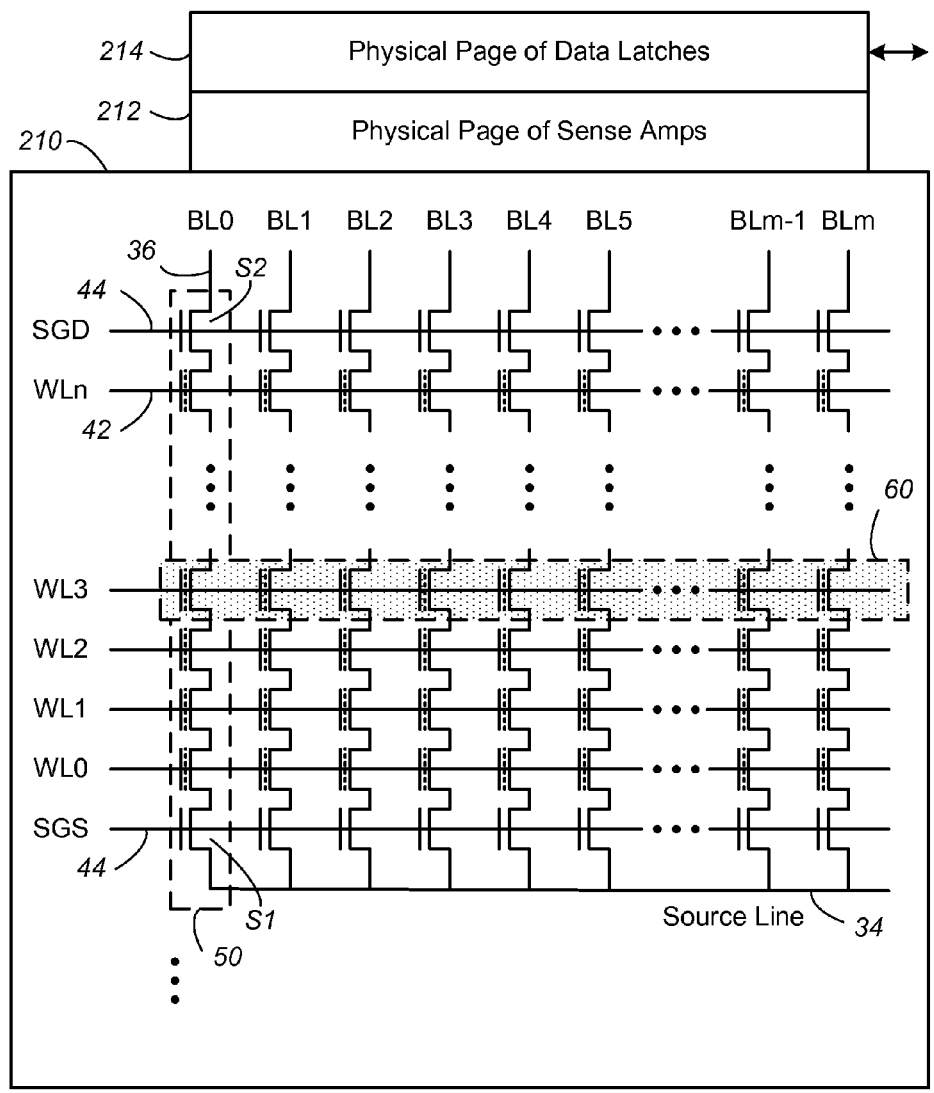
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a cell is programmed from the erased state. That is, the floating gate is first emptied of charge. Programming then adds a desired amount of charge back to the floating gate. It does not support removing a portion of the charge from the floating gate to go from a more programmed state to a lesser one. This means that updated data cannot overwrite existing data and is written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
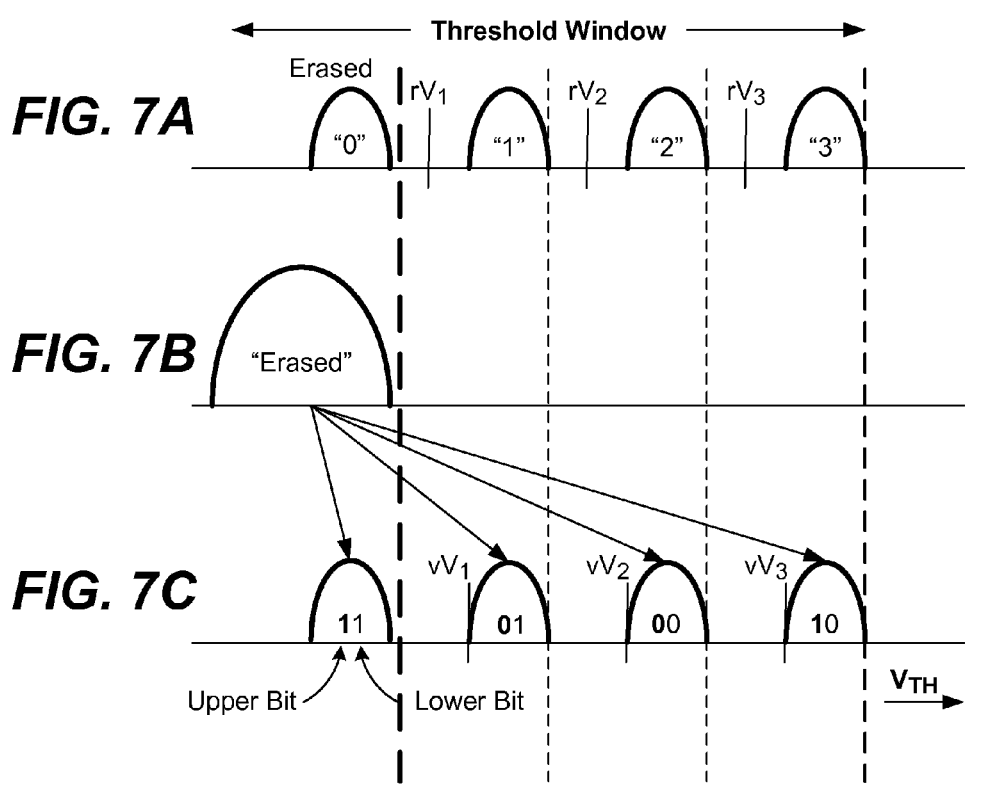
FIGS. 7A-7C illustrate an example of programming a population of memory cells.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 8:
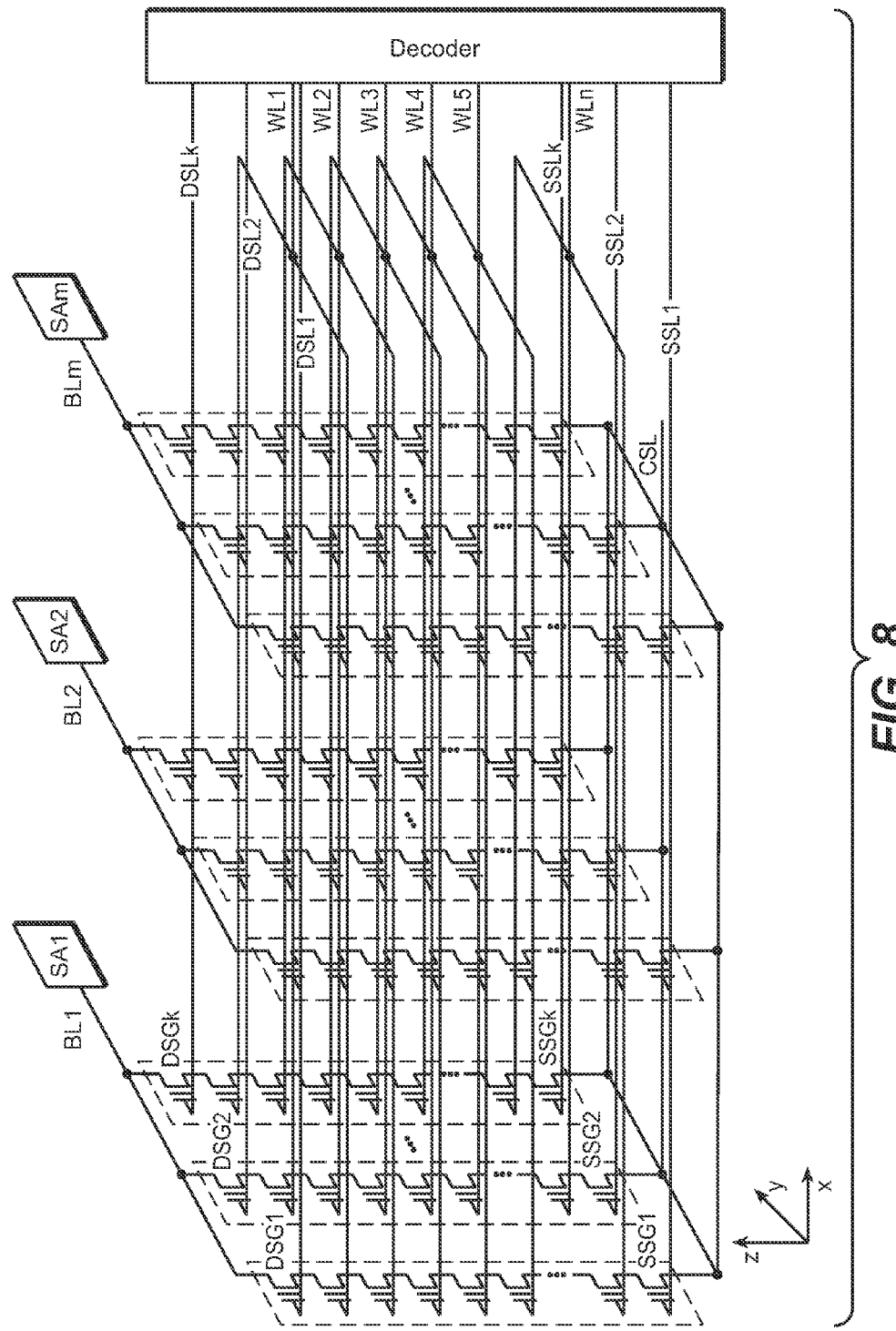
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-$m$, each run across the top to an associated sense amp SA1-$m$. The word lines, WL1-$n$, and source and select lines SSL1-$n$ and DSL1-$n$, then run in x direction, with the NAND string connected at bottom to a common source line CSL.

Figure 9:
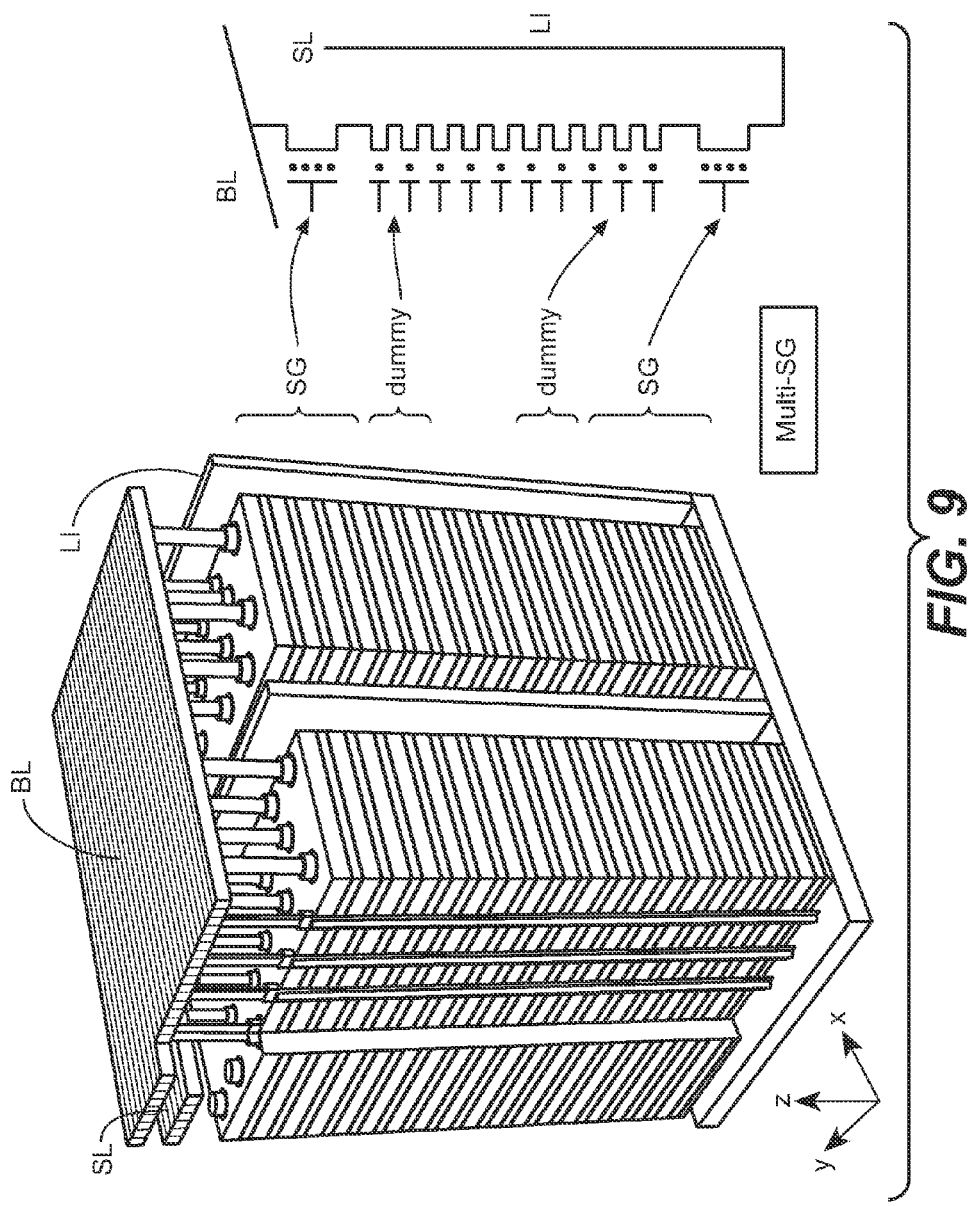
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 10:
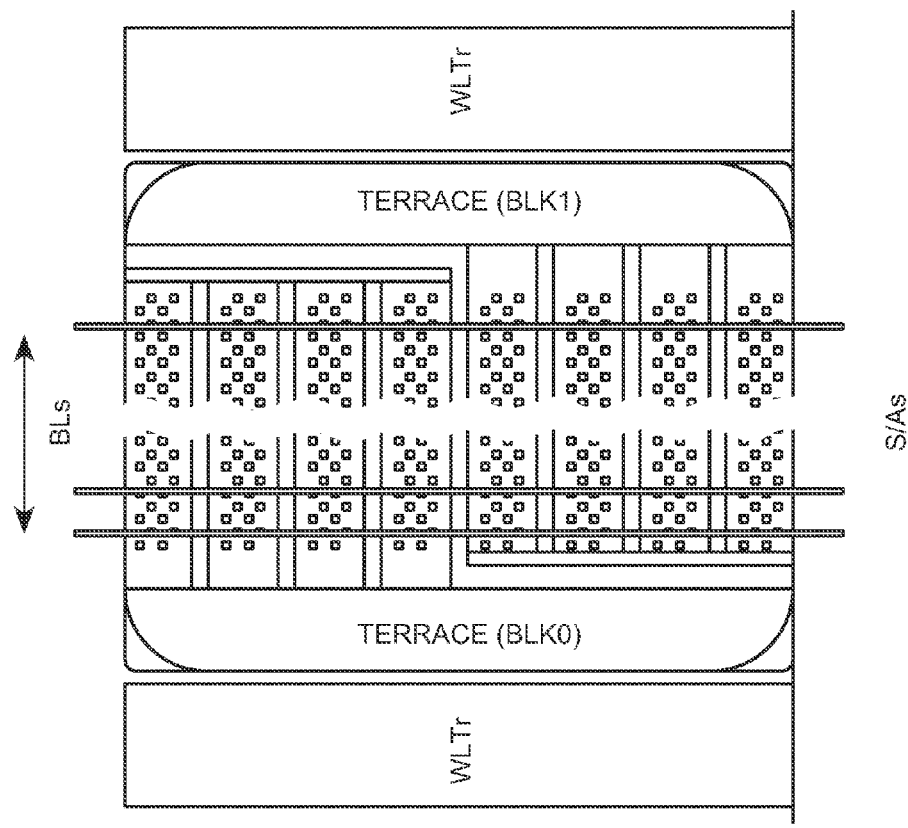

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
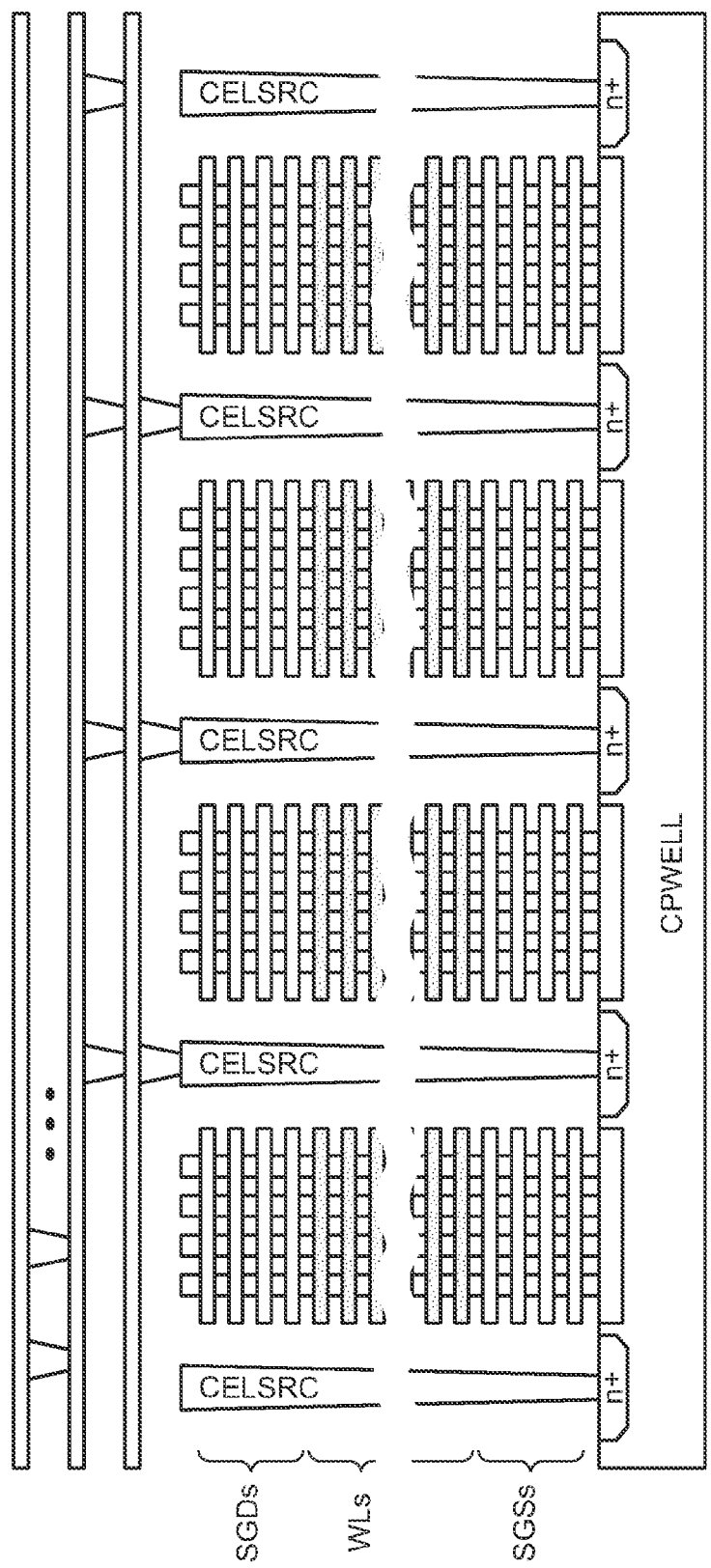

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
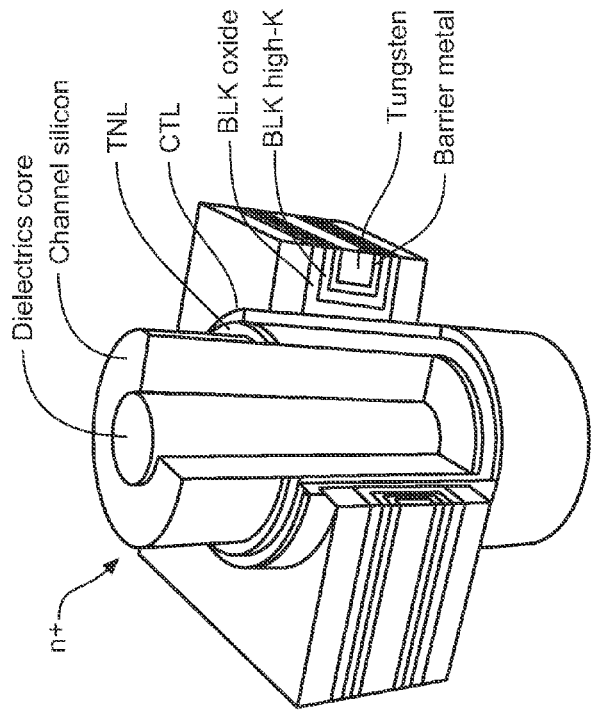

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Erase of Programmable Transistors

Figure 13:
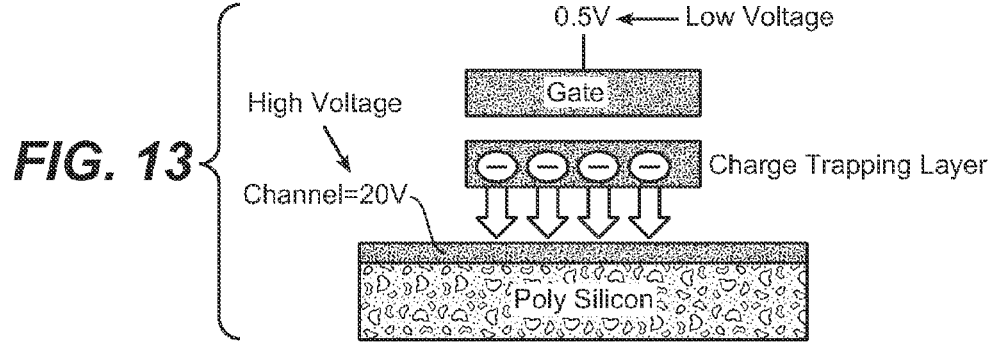
FIG. 13 illustrates the erase process for a programmable threshold transistor.

The goal of erase is to clean the electrons collected in the charge-trapping layer. By raising the channel to a high voltage, and applying a low voltage to the gate, an electric field is created. The electrons are pushed out of the charge trapping layer back into the polysilicon. This is illustrated schematically in FIG. 13, where example values of 0.5V and 20V are respectively applied to the gate and channel of the transistor.

Figure 14A:
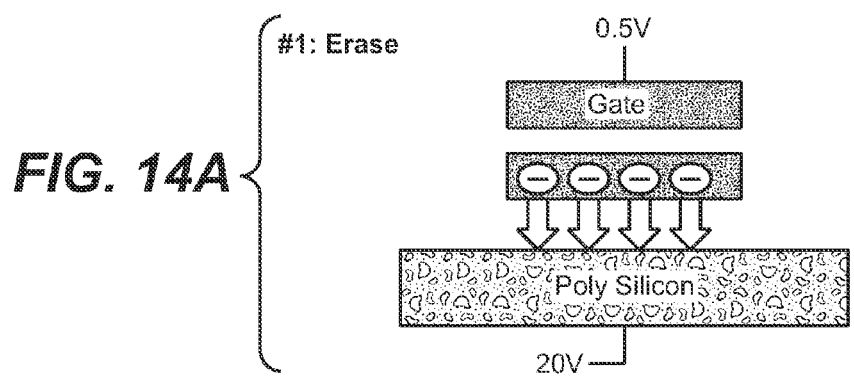
FIGS. 14A and 14B respectively illustrate erase enable and erase inhibit case.
Figure 14B:
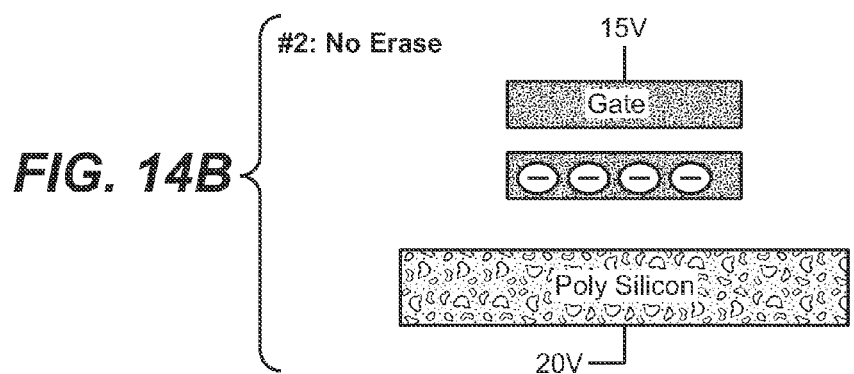

There are circumstances when it may be wanted to erase some, but not all, of the cells or other programmable transistors on the shared polysilicon that is raised to a high voltage in the erase process. For example, the BiCS structure described above uses programmable select gates and, when erasing the data cells of a block, it may not be wanted to erase any select gates or dummy word lines (i.e., word lines, typically end word lines or sets of word lines not storing user data) of the block. FIGS. 14A and 14B illustrate the two cases with some example voltages. FIG. 14A shows an erase enable case, where by applying a low voltage to the gate, a strong electric field is created and the electrons in the charge trapping layer are pushed back into the polysilicon. FIG. 14B looks at the erase inhibit case: By applying a high voltage to the gate, either no electric field or a very weak electric field is created and the electric field is not strong enough to push the electrons out of the charge trapping layer, thus the cell remains the same.

Figure 14C:
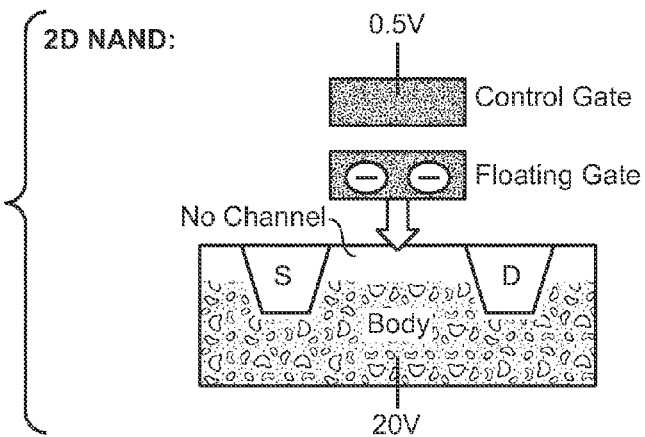
FIGS. 14C and 14D illustrate erase in 2D versus 3D memory structures.
Figure 14D:
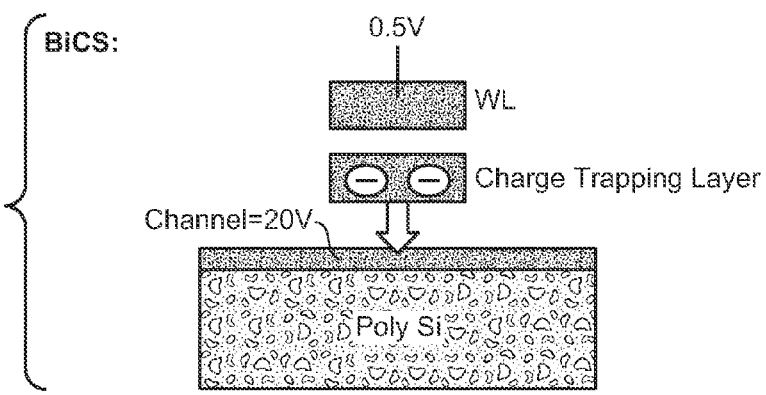

The erase process for a 3D/BiCS-type memory is different than for 2D NAND types of memory, as illustrated respectively in FIGS. 14D and 14C. In the 3D/BiCS, there is no body so that a channel must be passed through and the channel is made up of holes.

Figure 15A:
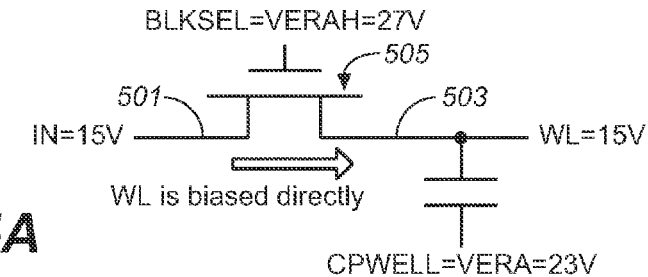
FIGS. 15A and 15B illustrate the direct bias erase inhibit technique.
Figure 15B:
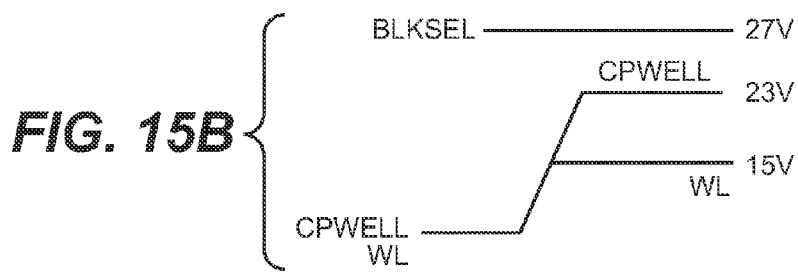
Figure 16A:
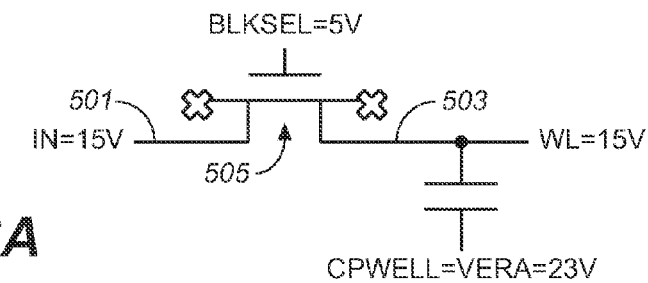
FIGS. 16A and 16B illustrate a coupling erase inhibit technique.
Figure 16B:
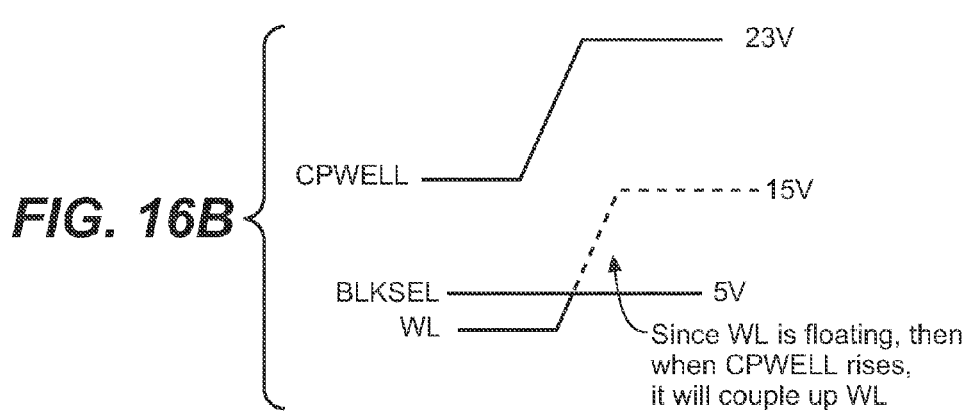

In order to inhibit erase of a programmable transistor, whether a memory cell or select gate, a high voltage is applied to the corresponding control line (word line or select gate line). This can be done by either a direct bias or coupling. FIGS. 15A and 15B illustrate the direct bias case. As shown schematically in FIG. 15A, a word line 503 is connected to an input line though decoding circuitry represented by the transistor 505. The word line is capacitively coupled to the well structure. To set the erase inhibit voltage (15V in this example) on the word line, the voltage is applied on the input line and a relatively high pass voltage VERAH is applied to the gate of the decoding transistor 503 to fully pass the voltage from the input line to the word line. With the word line (or select line) so biased, when the CP well voltage is set to the erase voltage VERA (=23V in this example). FIG. 15B illustrates the various waveforms.

FIGS. 15A and 15B illustrate the coupling case. FIG. 15A again shows a word line 503 connected to an input line though decoding circuitry represented by the transistor 505. The word line is capacitively coupled to the well structure. The transistor 505 shares decoding with other word lines and select lines of the NAND string or block so that the gate of 505 and the other lines that share decoding need to be set high enough to pass the low voltage (such as 0-3V) on the selected IN lines. Here 5V is applied to the gate of the block select (BLKSEL) transistor. The IN line is again at a higher voltage (here V=15), but once the voltage on the word line is greater than BLKSET less the threshold voltage of 505, WL>5V−Vt, the block select transistor will cut off, leaving the word line (or select line) to float. Due to the capacitive coupling to the well, as the word line is floating, as CPWELL rises it will also couple up the word line or select line to be erase inhibited.

The direct bias arrangement has the advantage that the word line voltage is set accurately as directly biased, but has the drawbacks that the select transistor gate needs to be brought to a high voltage level that induces high stress levels and consumes power. The coupling arrangement causes less stress and consumes less power, but is less accurate as the final voltage depends on coupling ratio between CPWELL and the control line; and if the word/select line level is not accurate the transistor may be erased or suffer dielectric breakdown.

Figure 17:
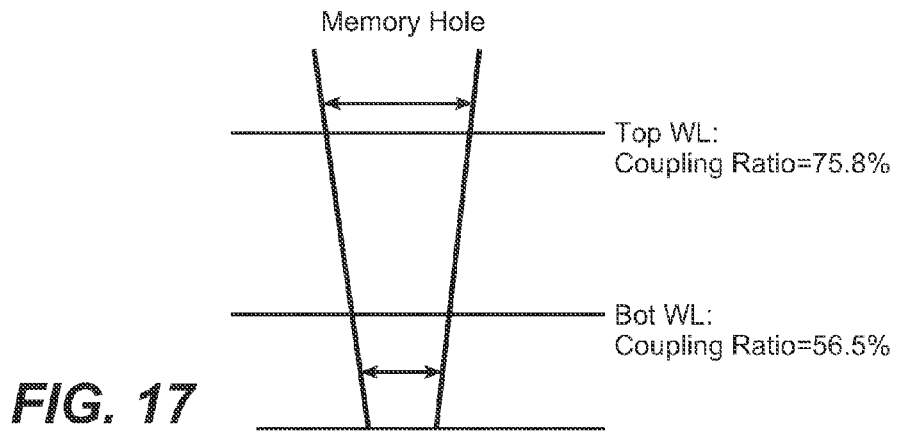
FIG. 17 is a schematic representation of word/select line to word/select line variation in coupling ratios in a vertical NAND arrangement.

This word line to word line variation in coupling ratios can be particularly pronounced in the vertical NAND arrangement of 3D/BiCS type memories, as is illustrated schematically with respect to FIG. 17. Due to memory hole width variation, the capacitance can change between word/select lines at the top, where the coupling ratio may be something like 75%, and word/select lines at the bottom, where the coupling ratios may be something like 50-60%. The bottom lines can have very low coupling ratios making it difficult for them to couple up to desired erase inhibit level. This situation is thus particularly acute in the case where the data word lines are to be erased, but the select gates, dummy word lines, or both are not to be erased, as these are the top-most and bottom-most lines. (These sorts of variations between top and bottom word lines can also affect read and program operations, as is discussed further in U.S. patent application Ser. Nos. 14/328,018; 14/486,152; and 14/508,352.)

Time Domain Ramp Rate Control for Erase Inhibit

As noted above, vertically arranged NAND memories, such as of the BiCS type, there is a big difference in the capacitance between the word/select lines at the top and at the bottom. Also, the lines at the bottom may have a low coupling ratio, making the word line voltage level during coupling erase difficult to make accurate and to bring to a high voltage level. This section looks at techniques for dealing with issue.

Figure 18A:
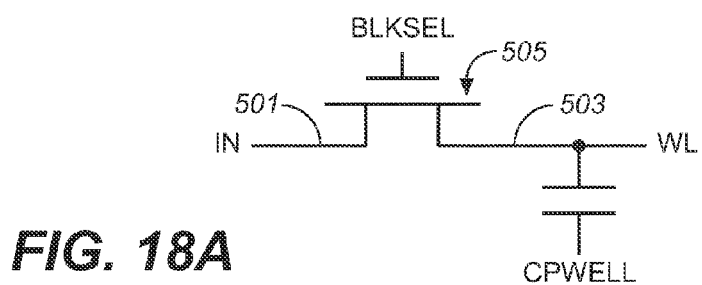
FIGS. 18A and 18B illustrate one approach to using capacitive coupling for erase inhibit.
Figure 18B:
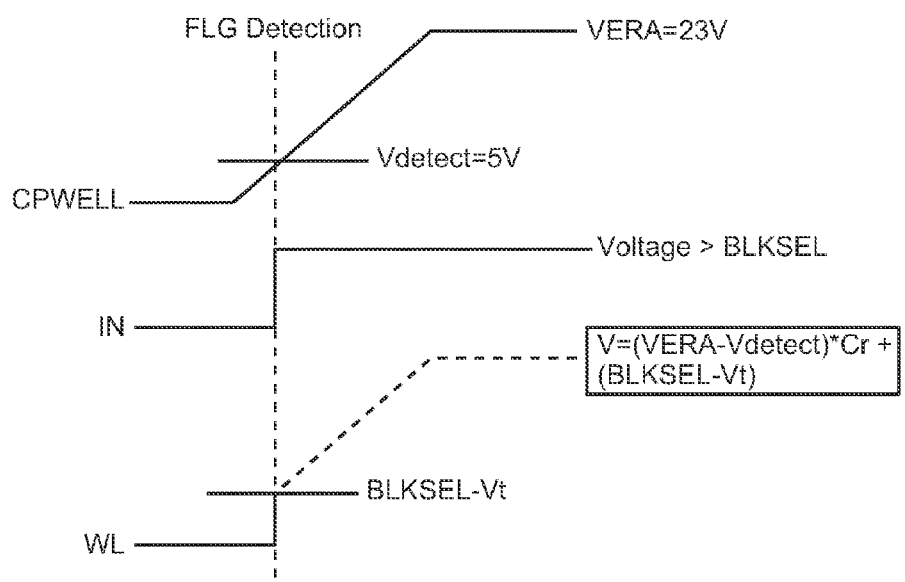

Considering coupling erase further, and referring to the arrangement of FIG. 18A which again shows a word line 503 capacitively coupled to the well and connected through a block decoding switch 505 to the input line 501, one approach illustrated with respect to FIG. 18B is to keep IN at VSS as CPWELL rises to above a level Vdetect. When CPWELL>Vdetect, a Flag will go high. When CPWELL>Vdetect, IN will rise to a voltage higher than BLKSEL, cutting off the transistor on that side as (BLKSEL−IN)<Vt, where Vt is the threshold voltage of the block select transistor 505. The word line will charge up to BLKSEL−Vt initially, then WL will be coupled up by CPWELL to its final level, where the amount the word line is coupled up by is determined by coupling ratio.

This arrangement has some limitations. A first is that the Vdetect level must be greater than (BLKSEL−Vt). If not, then when the word line charges up to (BLKSEL−Vt), it will be higher than CPWELL; and if WL>CPWELL, the channel cannot pass the holes. Also, the erased word line voltage can be 0V, and the neighbor cannot be too high due to dielectric breakdown. Another limitation of this arrangement is that it also has a direct dependence on Vt, so that depending on the process corner of the specific device, the Vt will change and this will have a direct effect on the final level. Additionally, due to first limitation, the final level of the word line may not be high enough.

To improve upon this situation, this section introduces a method for coupling erase that uses a time delay to create a voltage difference (delta) between the VERA level on the well and the word/select line voltage. It is also utilizes a ramp rate control so the input signal will ramp at same rate as VERA. More specifically, for the transistors to be erase inhibited, the raising of the IN level is delayed until CPWELL reaches a certain delta, after which IN rises at same rate as CPWELL. The word/select line will be directly biased until IN reaches BLKSEL−Vt, after which WL is coupled up to its final level as determined by the coupling ratio.

Figure 19A:
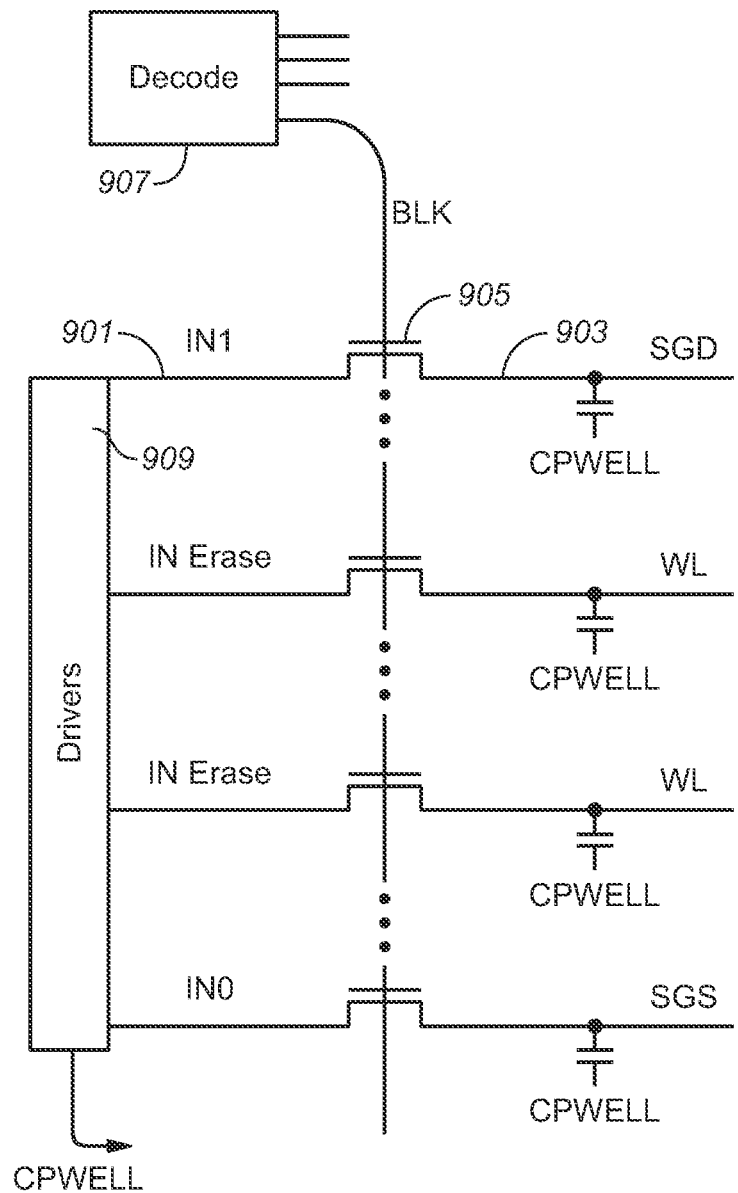
FIGS. 19A-C illustrate an exemplary embodiment for using capacitive coupling for erase inhibit.

FIG. 19A shows the word lines and select lines as would attach to a NAND string, where only end most drain and source select lines (SGD, SGS) and a pair of intervening word lines are shown. These lines are all capacitively coupled to the well and are connected to their corresponding IN line through the block select transistors, such as IN line 901 being connected through switch 903 for SGD line 905. (Under arrangements with multiple source and/or drain select gates, more than one transistor may an IN line and maybe also switch.) The decoding circuit 907 is connected to the gates of the block select transistors and the IN levels, as well as the well voltage, are provided by drivers 909. In this example, the select gates are to be erase inhibited and the intervening word lines to be erased. Consequently, the word lines have their corresponding IN lines set at a low, erase enable voltage, where this level is low enough to fully pass to the word lines.

Figure 19B:
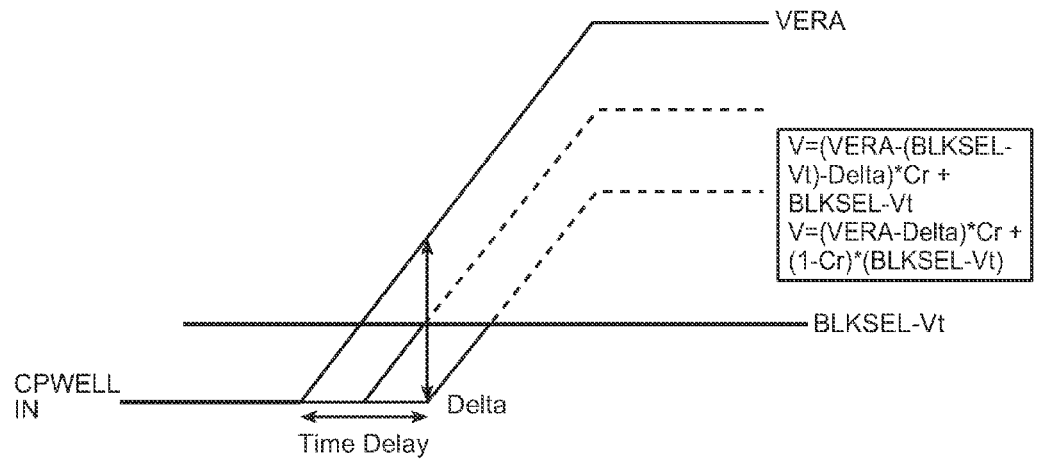

FIG. 19B illustrates the delaying the IN value relative to erase voltage VERA that is being applied to the well. After a time delay, IN ramps up and as long as it is below BLKSEL−Vt, it will set the level on the corresponding word or select gate line. Once at BLKSEL−Vt, the switch turns off and the line is then pulled up as illustrated by the dashed line to a level of:

$$V=(\text{VERA}-(\text{BLKSEL}-\text{Vt})-\text{Delta})*\text{Cr}+\text{BLKSEL}-\text{Vt}$$

$$=(\text{VERA}-\text{Delta})*\text{Cr}+(1-\text{Cr})*(\text{BLKSEL}-\text{Vt}),$$

where Cr is coupling ratio. In FIG. 19B, the dashed line showing the coupling up shows the situation for different delays, but for the same coupling ratio. Consequently, lines with different coupling ratios can use different delays to get to the same level. In the FIG. 19B, the value of IN is not shown once it reaches BLKSEL−Vt, as the switch turns off at this point, but it can continue on to BLKSEL as a convenient value or some lower level that, as it needs to be at least BLKSEL−Vt for all of the switches, that is offset to some lower level such as BLKSEL−½Vt.

Returning to FIG. 19A, the example is used where the two shown word lines are to be erased while inhibiting the two shown select gates. In the BiCS example, as discussed above with respect to FIG. 17, the bottom of the NAND string typically has a lower coupling ratio than at the top; and as the select gates are at the ends of the NAND string, the difference in coupling ratios between the source and drain side select gates can be pronounced. Consequently, IN1 at the drain side has a longer delay than the IN0 at the source. This is illustrated at FIG. 19C.

Figure 19C:
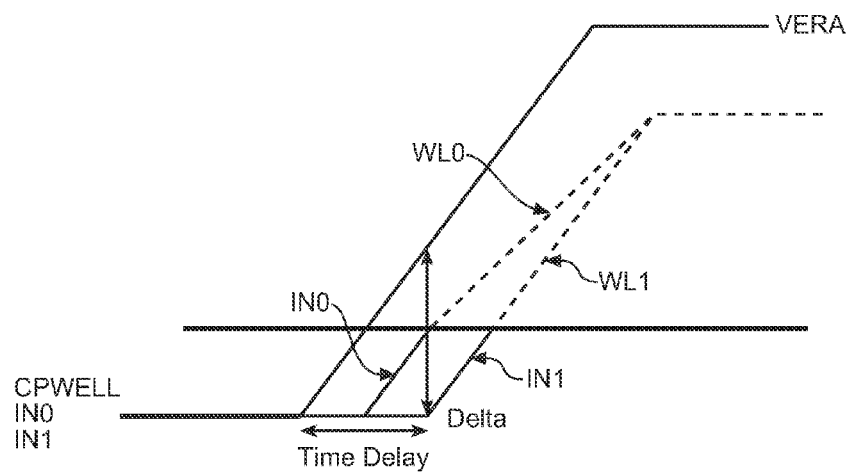

In the example of FIGS. 19A-C, the word lines were selected to be erased while the select gates were erase inhibited, but various combinations of select gates and word lines (both those holding data and dummy word lines) can be chosen. In terms of the amount of delay for the different word lines and select lines, these need not be set individually, but in adjacent groups: For example, all of the source side select lines can use the same delay, and all of the drain side select lines can use a common (but different than on the source side) delay; and if it is desired to erase inhibit word lines, the delays of all the word lines of a zone of adjacent word lines can have a common value. Alternately, the delays can be set individually if a particularly accurate coupling erase is desired, but at the cost being able to generate the appropriate values for each word/select line. The various delay values can be determined based upon device characterizations.

Under this arrangement, there is not the sort of limitation discussed above with respect to FIG. 18B that Vdetect needs to be greater than (BLKSEL−Vt). There is no restriction for the delta, so it can be adjusted to provide the final level needed. Also, the word and select line levels will be below CPWELL level, so that the channel maintains its conductivity for the whole string.

Additionally, the corner for the block select transistors' threshold voltage has a reduced effect on the file level as it is multiplied by (1−Cr), as seen in the equation above. Since the coupling ratio (Cr) is normally relatively high, the Vt value has a small effect on final level. A further advantage relative to the arrangement of FIG. 18B is that as no circuitry is need to detect the well level in order to determine when to raise IN, the area requirement is reduced.

CONCLUSION

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto.

It is claimed:

1. A non-volatile memory circuit, comprising:
   a string of a plurality of series connected programmable threshold transistors formed on a common channel structure;
   a plurality of control lines along which control gates of the programmable threshold transistors are connected;
   driver circuitry connectable to the control lines and to the channel structure;
   a plurality of input lines connected to the driver circuitry;
   a plurality of commonly controlled decoding transistors through which the driver circuitry is selectably connectable through the input lines to the control lines; and
   decoder circuitry connectable to control gates of the decoding transistors, wherein each of the input lines is connected to a corresponding one of the control lines through a corresponding one of the decoding transistors,
   wherein, when performing an erase operation on the string, the decoding circuitry applies a select voltage to the control gates of the commonly controlled decoding transistors and,
   wherein, with the decoding transistors on, the driving circuitry:
      applies an erase enable voltage to the input lines connected through corresponding ones of the decoding transistors to the control gates of programmable threshold transistors selected for erase,
      applies a voltage that ramps up to an erase level to the channel structure, and
      for a plurality of programmable threshold transistors selected to not be erased, applies an erase inhibit voltage to the input lines connected through corresponding ones of the decoding transistors, wherein after a delay the erase inhibit voltage ramps up with the voltage applied to the channel structure to a level sufficient to turn off the corresponding ones of the decoding transistors, where the amount of delay is one of a plurality of values dependent upon the location of the programmable threshold transistors within the string to which the erase inhibit voltage is applied.

2. The non-volatile memory circuit of claim 1, wherein the programmable threshold transistors selected to not be erased includes select gate transistors of the string and the programmable threshold transistors selected for erase includes memory cells.

3. The non-volatile memory circuit of claim 1, wherein the programmable threshold transistors selected to not be erased includes dummy memory cells and the programmable threshold transistors selected for erase includes memory cells used for the storing of user data.

4. The non-volatile memory circuit of claim 1, wherein the programmable threshold transistors selected to be erased includes select gate transistors of the string and the programmable threshold transistors selected to not be erased includes memory cells.

5. The non-volatile memory circuit of claim 1, wherein the programmable threshold transistors selected to be erased includes dummy memory cells and the programmable threshold transistors selected to not be erased includes memory cells used for the storing of user data.

6. The non-volatile memory circuit of claim 1, wherein the programmable threshold transistors selected to be erased includes dummy memory cells and the programmable threshold transistors selected to be erased includes memory cells used for the storing of user data.

7. The non-volatile memory circuit of claim 1, wherein the erase inhibit voltage ramps up to at least the select voltage applied to the control gates of the commonly controlled decoding transistors.

8. The non-volatile memory circuit of claim 1, wherein the erase inhibit voltage ramps up to a level offset below the select voltage applied to the control gates of the commonly controlled decoding transistors, wherein the offset is related to a threshold voltage of the commonly controlled decoding transistors.

9. The non-volatile memory circuit of claim 1, wherein the memory circuit is a monolithic two-dimensional semiconductor memory device where the programmable threshold transistors are arranged in single physical level above a silicon substrate and comprise a charge storage medium.

10. The non-volatile memory circuit of claim 9, wherein channel structure is within the substrate.

11. The non-volatile memory circuit of claim 1, wherein memory circuit is a monolithic three-dimensional semiconductor memory device where the programmable threshold transistors are arranged in multiple physical levels above a silicon substrate and comprise a charge storage medium.

12. The non-volatile memory circuit of claim 11, wherein the string is formed above a well structure and runs in a vertical direction relative to the substrate, and wherein the driving circuitry applies the voltage that ramps up to an erase level to the channel structure through the well structure.

13. The non-volatile memory circuit of claim 1, wherein amount of delay of the programmable threshold transistors on a drain side of the string of a plurality of series connected programmable threshold transistors is greater than the amount of delay of the programmable threshold transistors on a source side of the string of a plurality of series connected programmable threshold transistors.

14. The non-volatile memory circuit of claim 1, wherein the programmable threshold transistors selected to be erased includes select gate transistors of the string and the programmable threshold transistors selected to not be erased includes dummy memory cells.

15. The non-volatile memory circuit of claim 1, wherein the programmable threshold transistors selected to be erased includes one or more first select gate transistors of the string and the programmable threshold transistors selected to not be erased includes one or more second select gate transistors.

\* \* \* \* \*